(12) United States Patent
Zhang et al.

(10) Patent No.: US 12,293,701 B2
(45) Date of Patent: May 6, 2025

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Huanxi Zhang, Hubei (CN); Cheng Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 18/260,131

(22) PCT Filed: May 12, 2023

(86) PCT No.: PCT/CN2023/094047
§ 371 (c)(1),
(2) Date: Jun. 30, 2023

(87) PCT Pub. No.: WO2024/216689
PCT Pub. Date: Oct. 24, 2024

(65) Prior Publication Data
US 2024/0379045 A1    Nov. 14, 2024

(30) Foreign Application Priority Data

Apr. 21, 2023    (CN) .......................... 202310439309.X

(51) Int. Cl.
*G09G 3/32*       (2016.01)
*G09G 3/3266*     (2016.01)

(52) U.S. Cl.
CPC ............. *G09G 3/32* (2013.01); *G09G 3/3266* (2013.01); *G09G 2310/0267* (2013.01); *G09G 2310/08* (2013.01); *G09G 2320/0233* (2013.01)

(58) Field of Classification Search
CPC .................. G09G 3/32; G09G 3/3266; G09G 2310/0267; G09G 2310/08;
(Continued)

(56) References Cited

U.S. PATENT DOCUMENTS

2021/0242255 A1*    8/2021  Wang ................... H10K 59/131
2022/0013618 A1*    1/2022  Park ..................... H10K 59/131

FOREIGN PATENT DOCUMENTS

CN    107705756 A    2/2018
CN    111710240 A    9/2020
(Continued)

OTHER PUBLICATIONS

International Search Report in International application No. PCT/CN2023/094047, mailed on Jan. 4, 2024.
(Continued)

*Primary Examiner* — Brent D Castiaux
(74) *Attorney, Agent, or Firm* — PV IP PC; Wei Te Chung

(57) ABSTRACT

A display panel and a display device are provided by the present application. A first part and a second part of part of a first scanning signal line are connected through a third part, and/or a fourth part and a fifth part of part of the first scanning signal line are connected through a sixth part, so that a load of a hole-digging area is similar or even consistent with a load of other areas, thereby improving a display effect.

20 Claims, 10 Drawing Sheets

(58) Field of Classification Search
CPC ......... G09G 2320/0233; G09G 3/3233; G09G 3/3225; H10K 59/121; H10K 59/131; G06F 9/30
See application file for complete search history.

(56) References Cited

FOREIGN PATENT DOCUMENTS

| | | |
|---|---|---|
| CN | 114842746 A | 8/2022 |
| CN | 115064574 A | 9/2022 |
| CN | 115373173 A | 11/2022 |
| KR | 20110032341 A | 3/2011 |

OTHER PUBLICATIONS

Written Opinion of the International Search Authority in International application No. PCT/CN2023/094047, mailed on Jan. 4, 2024.

* cited by examiner (a)

(b)

(c)

DISPLAY PANEL AND DISPLAY DEVICE

CROSS-REFERENCE TO RELATED APPLICATIONS

This application is a continuation of International Application No. PCT/CN2023/094047, filed on May 12, 2023, which claims priority to and the benefit of Chinese Patent Application No. 202310439309.X, filed on Apr. 21, 2023. The disclosures of the aforementioned applications are incorporated herein by reference in their entireties.

TECHNICAL FIELD

The present application relates to a technical field of display, and in particular to a display panel and a display device.

BACKGROUND

With a development of display devices, existing display devices have higher and higher requirements for power consumption and screen ratio. In order to reduce the power consumption and increase the screen ratio, the existing display devices may adopt low temperature polysilicon oxide (LTPO) technology and O-cut technology. In order to solve a frequency-cutting flicker problem existed in a 7T2C LTPO circuit, the existing display devices may adopt an 8T2C circuit. At a same time, in order to reduce a border of an O-cut area, the existing display devices combine a gate controlling signal line with two adjacent rows of signal lines into one wiring to bypass the O-cut area, thereby realizing an electrical connection of the signal lines on both sides of the O-cut area and reducing the border of the O-cut area. However, in actual verification processes, it is found that a load of signal lines in the O-cut area is inconsistent with a load of signal lines in other areas, resulting in uneven display of the display devices, specifically showing a phenomenon of split screen between the O-cut area and the other areas, resulting in poor display.

Therefore, there is a technical problem existed in the existing display devices that the load of the signal lines in the O-cut area is inconsistent with the load of the signal lines in other areas, resulting in uneven display.

SUMMARY

A display panel and a display device are provided by the present application to alleviate a technical problem that a load of signal lines in an O-cut area is inconsistent with a load of signal lines in other areas, resulting in uneven display.

In order to solve above problem, technical solutions provided by the present application are as follows:

The embodiments of the present application provide a display panel, including:
a display area and a hole-digging area surrounded by the display area, the display panel includes a plurality of light-emitting devices arranged in an array and a pixel driving circuit driving the plurality of light-emitting devices, and the pixel driving circuit includes:
a driving transistor;
a switching transistor, connected to the driving transistor at a first node;
a compensation transistor, connected to a first scanning signal line, the compensation transistor, the driving transistor, and the plurality of light-emitting devices are connected at a second node; and
a first initialization transistor, connected to a second scanning signal line, the first initialization transistor, the driving transistor, and the compensation transistor are connected at a third node;
at least part of the first scanning signal line includes a first part located at a left side of the hole-digging area, a second part located at a right side of the hole-digging area, and a third part connected to the first part and the second part, and an extension line of the first part passes through the hole-digging area; and/or, at least part of the second scanning signal line includes a fourth part located at the left side of the hole-digging area, a fifth part located at the right side of the hole-digging area, and a sixth part connected to the fourth part and the fifth part, and an extension line of the fourth part passes through the hole-digging area.

In some embodiments, the display panel further includes:
a substrate;
a first active layer, disposed on a side of the substrate;
a first metal layer, disposed on a side of the first active layer away from the substrate;
a second metal layer, disposed on a side of the first metal layer away from the first active layer;
a second active layer, disposed on a side of the second metal layer away from the first metal layer; and
a third metal layer, disposed on a side of the second active layer away from the second metal layer;
the third part is disposed in at least one of the first metal layer, the second metal layer, and the third metal layer, and the sixth part is disposed in at least one of the first metal layer, the second metal layer, and the third metal layer.

In some embodiments, the first part includes a first sub-part and a second sub-part located in respective metal layers; the second part includes a third sub-part disposed in a same layer as the first sub-part and a fourth sub-part disposed in a same layer as the second sub-part, and the first sub-part and the second sub-part are connected to the third sub-part and the fourth sub-part through the third part.

In some embodiments, the third part and one of the first sub-part and the second sub-part are disposed in a same layer, at a junction of the hole-digging area and the display area, the first sub-part is connected to the second sub-part, the third sub-part is connected to the fourth sub-part, and the first sub-part is connected to the third sub-part through the third part.

In some embodiments, the third part is disposed in the first metal layer, or the third part is disposed in the second metal layer, or the third part is disposed in the third metal layer.

In some embodiments, the third part includes a fifth sub-part disposed in a same layer as the first sub-part and a sixth sub-part disposed in a same layer as the second sub-part, the first sub-part is connected to the third sub-part through the fifth sub-part, and the second sub-part is connected to the fourth sub-part through the sixth sub-part.

In some embodiments, the fifth sub-part is disposed in the first metal layer, and the sixth sub-part is disposed in the second metal layer; or the fifth sub-part is disposed in the first metal layer, and the sixth sub-part is disposed in the third metal layer; or the fifth sub-part is disposed in the second metal layer, and the sixth sub-part is disposed in the third metal layer.

In some embodiments, a projection of the fifth sub-part on the substrate is overlapped with a projection of the sixth sub-part on the substrate.

In some embodiments, the fourth part includes a seventh sub-part and an eighth sub-part located in respective metal layers; the fifth part includes a ninth sub-part disposed in a same layer as the seventh sub-part and a tenth sub-part disposed in a same layer as the eighth sub-part, and the seventh sub-part and the eighth sub-part are connected to the ninth sub-part and the tenth sub-part through the sixth part.

In some embodiments, the sixth part and one of the seventh sub-part and the eighth sub-part are disposed in a same layer, at a junction of the hole-digging area and the display area, the seventh sub-part is connected to the eighth sub-part, the ninth sub-part is connected to the tenth sub-part, and the seventh sub-part is connected to the ninth sub-part through the sixth part.

In some embodiments, the sixth part is disposed in the first metal layer, or the sixth part is disposed in the second metal layer, or the sixth part is disposed in the third metal layer.

In some embodiments, the sixth part includes an eleventh sub-part disposed in a same layer as the seventh sub-part and a twelfth sub-part disposed in a same layer as the eighth sub-part, the seventh sub-part is connected to the ninth sub-part through the eleventh sub-part, and the eighth sub-part is connected to the tenth sub-part through the twelfth sub-part.

In some embodiments, the eleventh sub-part is disposed in the first metal layer, and the twelfth sub-part is disposed in the second metal layer; or the eleventh sub-part is disposed in the first metal layer, and the twelfth sub-part is disposed in the third metal layer; or the eleventh sub-part is disposed in the second metal layer, and the twelfth sub-part is disposed in the third metal layer.

In some embodiments, a projection of the eleventh sub-part on the substrate is overlapped with a projection of the twelfth sub-part on the substrate.

In some embodiments, the display panel further includes gate driving units, the gate driving units include first gate driving units and second gate driving units, two adjacent rows of first scanning signal lines are connected to a same one of the first gate driving units, and two adjacent rows of the second scanning signal lines are connected to a same one of the second gate driving units.

Meanwhile, the embodiments of the present application provide a display device including a display panel, the display panel includes a display area and a hole-digging area surrounded by the display area, the display panel includes a plurality of light-emitting devices arranged in an array and a pixel driving circuit driving the plurality of light-emitting devices, and the pixel driving circuit includes:
  a driving transistor;
  a switching transistor, connected to the driving transistor at a first node;
  a compensation transistor, connected to a first scanning signal line, the compensation transistor, the driving transistor, and the plurality of light-emitting devices are connected at a second node; and
  a first initialization transistor, connected to a second scanning signal line, the first initialization transistor, the driving transistor, and the compensation transistor are connected at a third node;
  at least part of the first scanning signal line includes a first part located at a left side of the hole-digging area, a second part located at a right side of the hole-digging area, and a third part connected to the first part and the second part, and an extension line of the first part passes through the hole-digging area; and/or, at least part of the second scanning signal line includes a fourth part located at the left side of the hole-digging area, a fifth part located at the right side of the hole-digging area, and a sixth part connected to the fourth part and the fifth part, and an extension line of the fourth part passes through the hole-digging area.

In some embodiments, the display device includes:
  a substrate;
  a first active layer, disposed on a side of the substrate;
  a first metal layer, disposed on a side of the first active layer away from the substrate;
  a second metal layer, disposed on a side of the first metal layer away from the first active layer;
  a second active layer, disposed on a side of the second metal layer away from the first metal layer; and
  a third metal layer, disposed on a side of the second active layer away from the second metal layer;
  the third part is disposed in at least one of the first metal layer, the second metal layer, and the third metal layer, and the sixth part is disposed in at least one of the first metal layer, the second metal layer, and the third metal layer.

In some embodiments, the first part includes a first sub-part and a second sub-part located in respective metal layers; the second part includes a third sub-part disposed in a same layer as the first sub-part and a fourth sub-part disposed in a same layer as the second sub-part, and the first sub-part and the second sub-part are connected to the third sub-part and the fourth sub-part through the third part.

In some embodiments, the third part and one of the first sub-part and the second sub-part are disposed in a same layer, at a junction of the hole-digging area and the display area, the first sub-part is connected to the second sub-part, the third sub-part is connected to the fourth sub-part, and the first sub-part is connected to the third sub-part through the third part.

In some embodiments, the third part is disposed in the first metal layer, or the third part is disposed in the second metal layer, or the third part is disposed in the third metal layer.

BENEFICIAL EFFECTS

The display panel and the display device are provided by the present application. The display panel includes the display area and the hole-digging area. The display area is disposed surrounding the display area. The display area includes the plurality of light-emitting devices arranged in the array and the pixel driving circuit driving the plurality of light-emitting devices. The pixel driving circuit includes the driving transistor, the switching transistor, and the compensation transistor. A gate electrode of the driving transistor is connected to the first node. A first electrode of the driving transistor is connected to the second node. The driving transistor is configured to drive the plurality of light-emitting devices to emit light under a control of potentials of the first node and the second node. A gate electrode of the switching transistor is connected to the first scanning signal line. The switching transistor is configured to input a data signal to the second node under a control of the first scanning signal. A gate electrode of the compensation transistor is connected to the first scanning signal line. A first electrode of the compensation transistor is connected to the driving transistor through the first node, and a second electrode of the compensation transistor is connected to the driving transistor through the third node. The switching transistor is configured to compensate a threshold voltage of the driving transistor under a control of the second scanning signal. A gate electrode of the first initialization transistor is connected to the second scanning signal line, and the first initialization transistor is configured to input a first initialization signal to the first node under a control of a third scanning signal. At least part of the first scanning signal line includes the first part located at the left side of the hole-digging area, the second part located at the right side of the hole-digging area, and the third part connected to the first part and the second part. The extension line of the first part passes through the hole-digging area. And/or, at least part of the second scanning signal line includes the fourth part located at the left side of the hole-digging area, the fifth part located at the right side of the hole-digging area, and the sixth part connected to the fourth part and the fifth part. The extension line of the fourth part passes through the hole-digging area. In the present application, by making that the first part and the second part of the at least part of the first scanning signal line are connected through the third part, each first scanning signal line is wound from the left side of the hole-digging area to the right side of the hole-digging area alone, and an impedance of the first scanning signal line wound from the hole-digging area is similar to or even consistent with to an impedance of the first scanning signal line in other areas. And/or, the fourth part and the fifth part of the at least part of the first scanning signal line are connected through the sixth part, so that each second scanning signal line is wound from the left side of the hole-digging area to the right side of the hole-digging area alone, and an impedance of the second scanning signal line wound from the hole-digging area is similar to or even consistent with to an impedance of the second scanning signal line in other areas. Therefore, a load of a hole-digging area is similar or even consistent with a load of other areas, thereby improving a display effect.

BRIEF DESCRIPTION OF THE DRAWINGS

The technical solutions, as well as other beneficial advantages, of the present application will be apparent from the following detailed descriptions of embodiments of the present application, with reference to the attached drawings.

DETAILED DESCRIPTION

The present application is described in detail below with reference to the accompanying drawings and specific embodiments. Apparently, the described embodiments are merely a part of but not all embodiments of the present application. All other embodiments obtained by persons of ordinary skill in the art based on the embodiments of the present application without creative efforts shall fall within a protection scope of the present application.

The embodiments of the present application aim at a technical problem that a load of a signal line in the O-cut area is inconsistent with a load of a signal line in other areas, resulting in uneven display.

Figure 1:
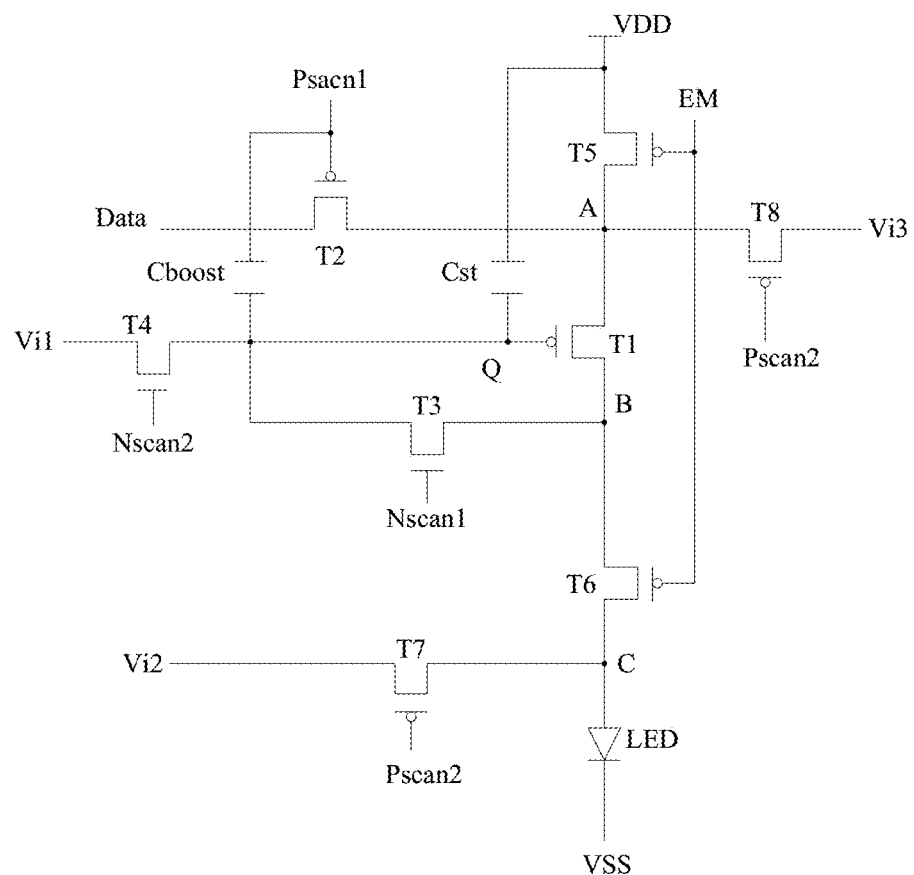
FIG. 1 is a circuit diagram of a display panel provided by an embodiment of the present application.
Figure 2:
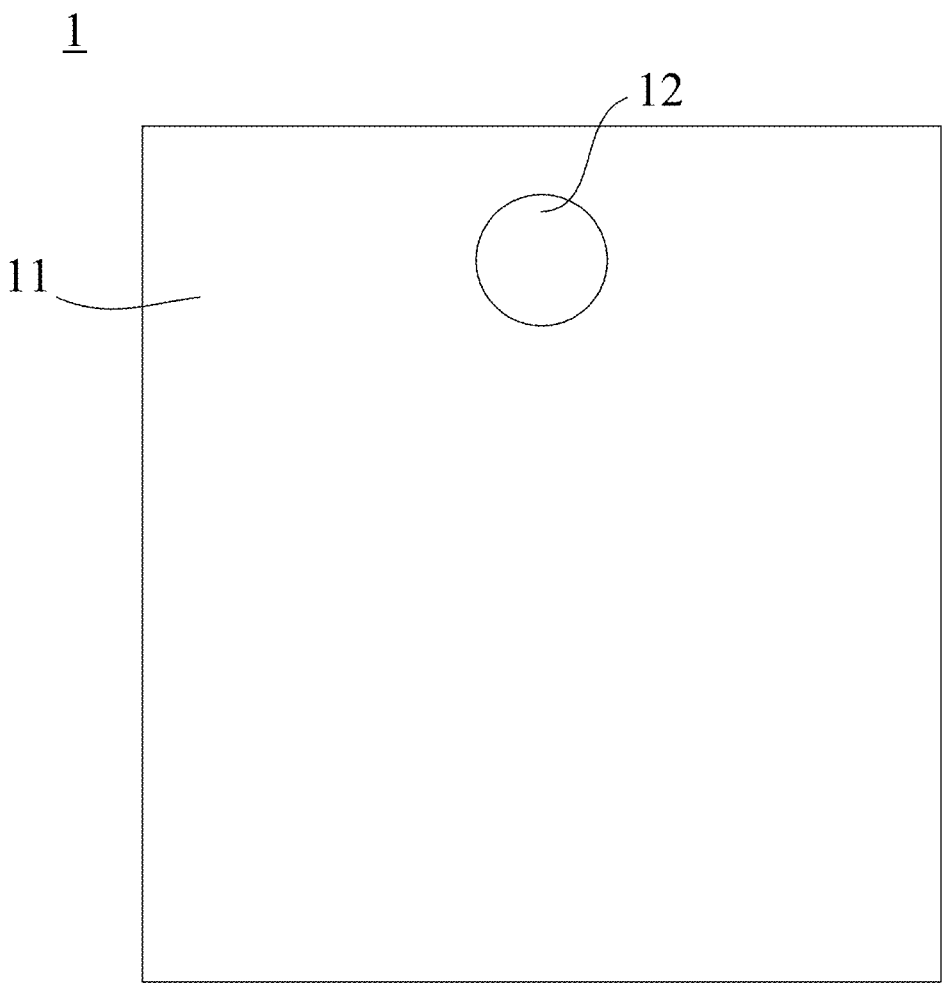
FIG. 2 is a first schematic diagram of the display panel provided by an embodiment of the present application.
Figure 3:
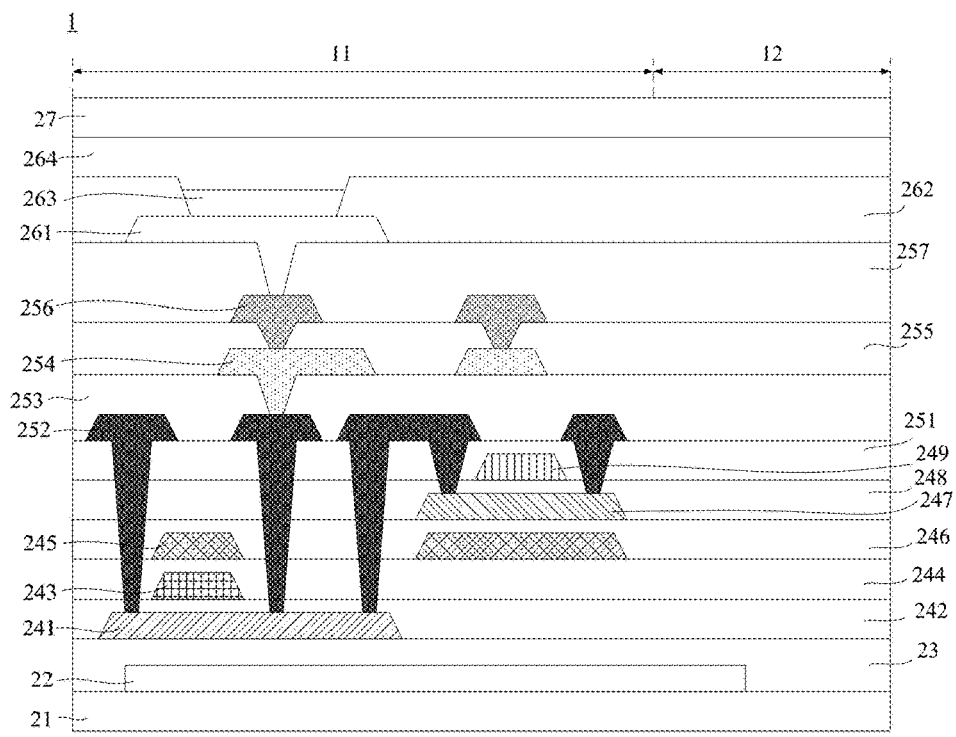
FIG. 3 is a second schematic diagram of the display panel provided by an embodiment of the present application.
Figure 4:
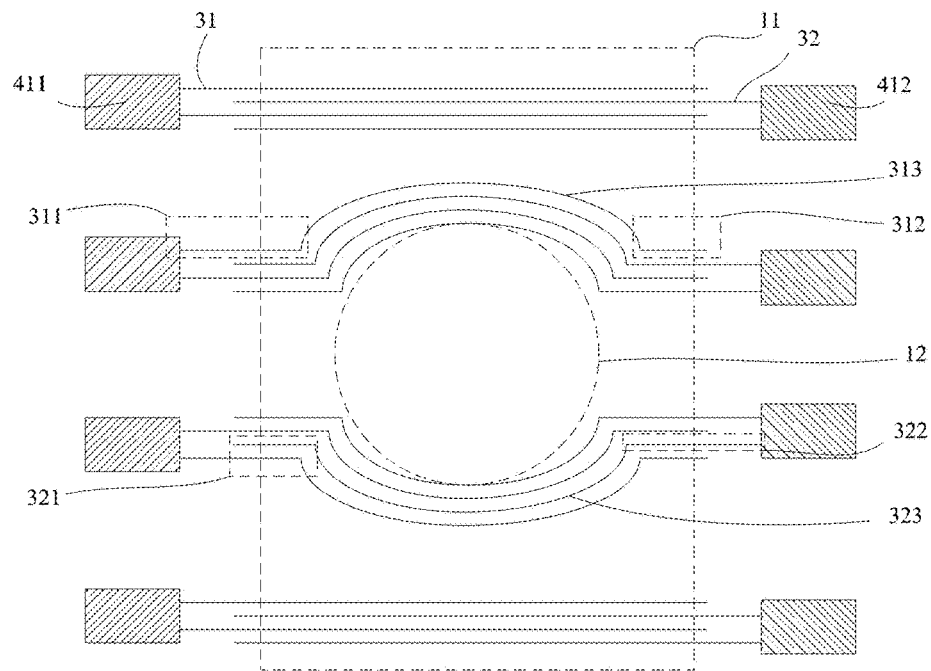
FIG. 4 is a third schematic diagram of the display panel provided by an embodiment of the present application.
Figure 5:
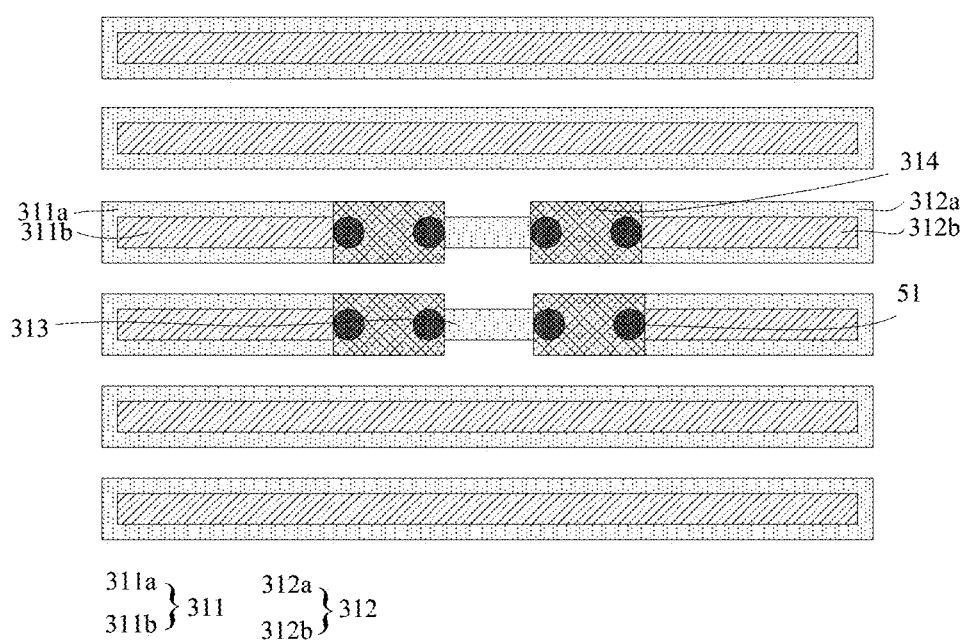
FIG. 5 is a first schematic diagram of a first scanning signal line provided by an embodiment of the present application.
Figure 6:
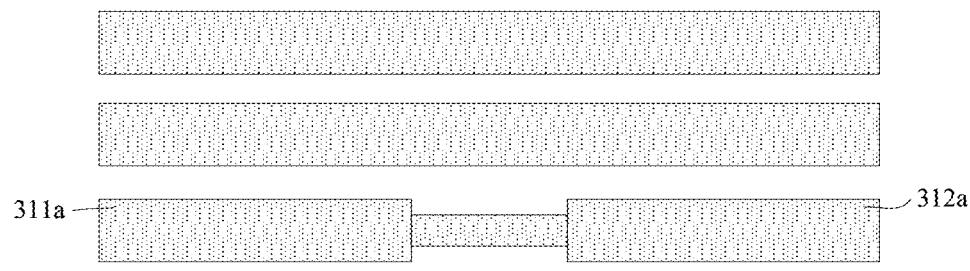
FIG. 6 is an exploded diagram of the first scanning signal line in FIG. 5.
Figure 6:
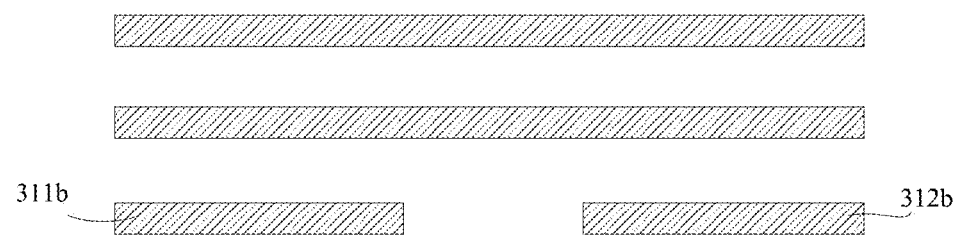
Figure 6:
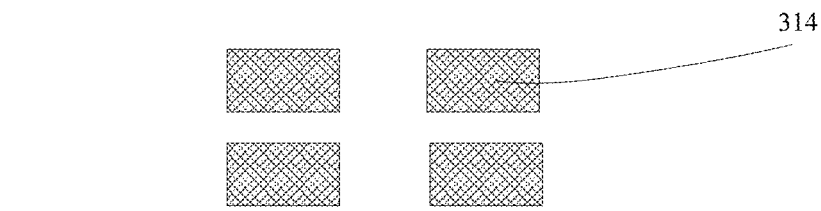
Figure 7:
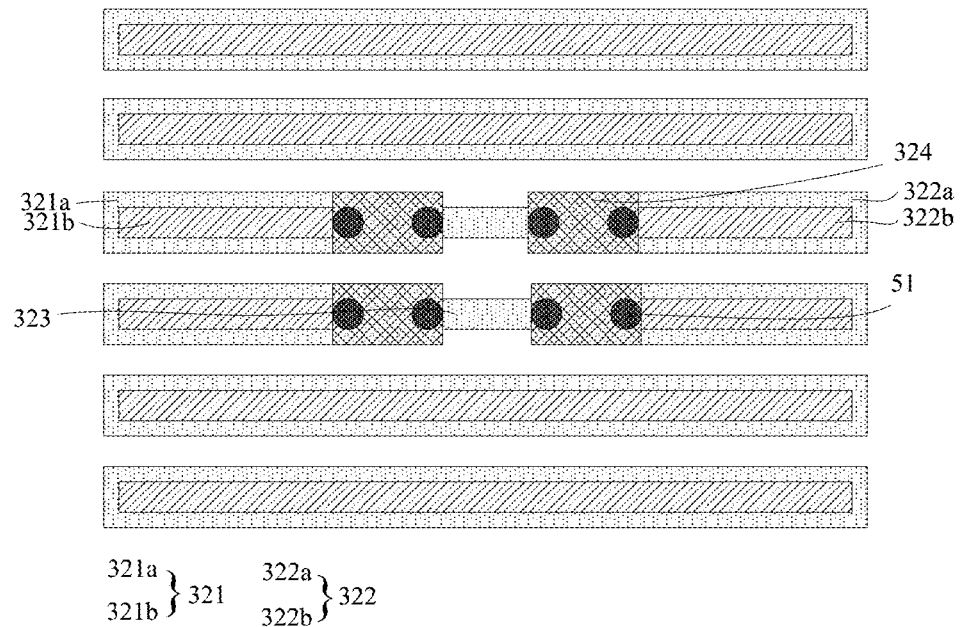
FIG. 7 is a first schematic diagram of a second scanning signal line provided by an embodiment of the present application.
Figure 8:
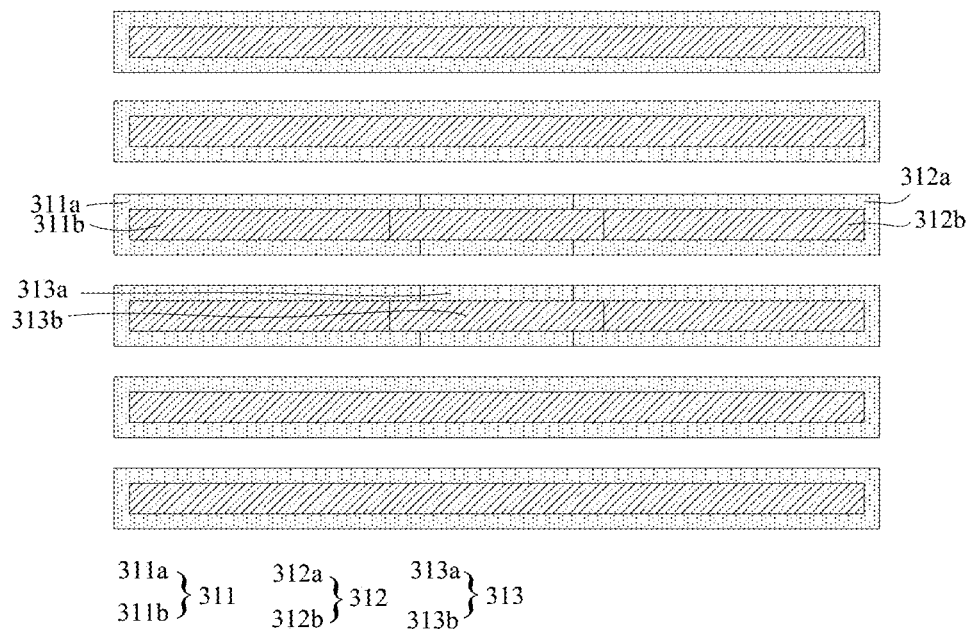
FIG. 8 is a second schematic diagram of the first scanning signal line provided by an embodiment of the present application.
Figure 9:
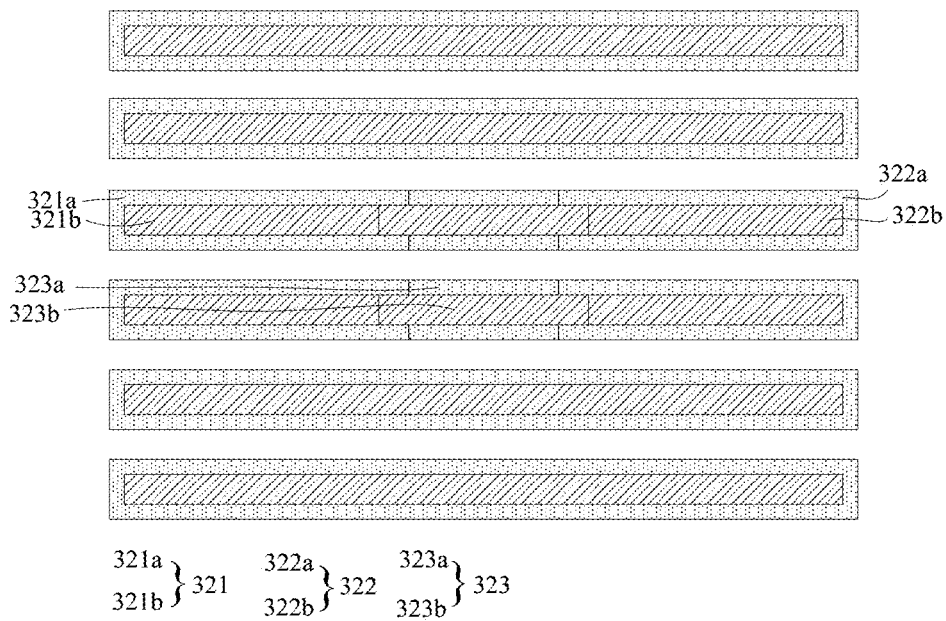
FIG. 9 is a second schematic diagram of the second scanning signal line provided by an embodiment of the present application.
Figure 10:
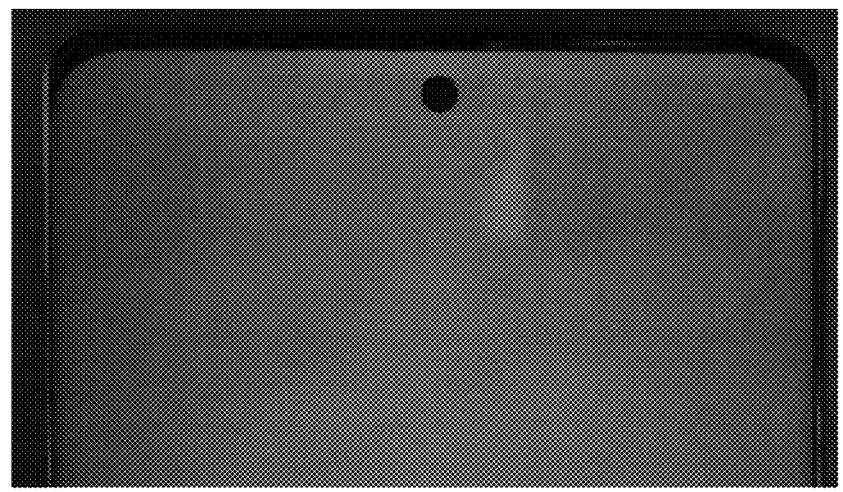
FIG. 10 is a first schematic diagram of an existing display device.
Figure 11:
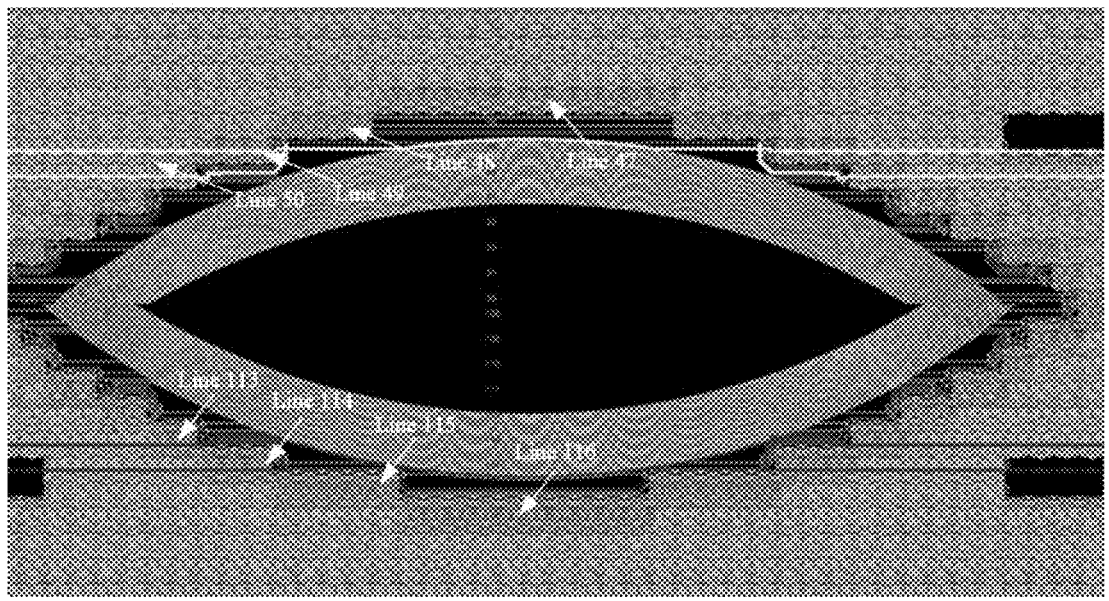
FIG. 11 is a product diagram of the existing display device.
Figure 12:
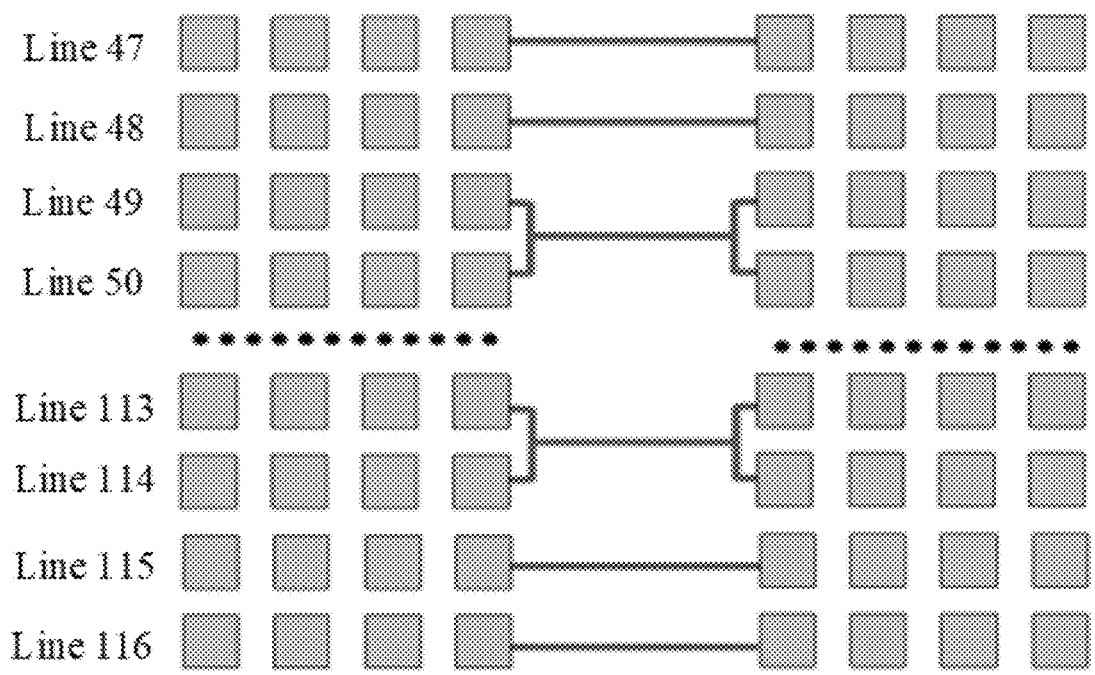
FIG. 12 is a second schematic diagram of the existing display device.
Figure 13:
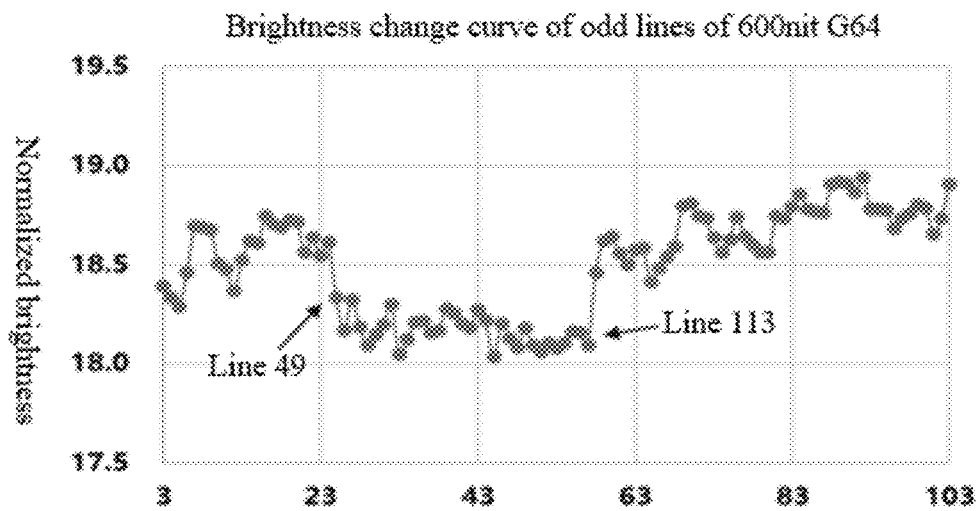
FIG. 13 is a brightness curve diagram of each row of pixels of the existing display device.
Figure 14:
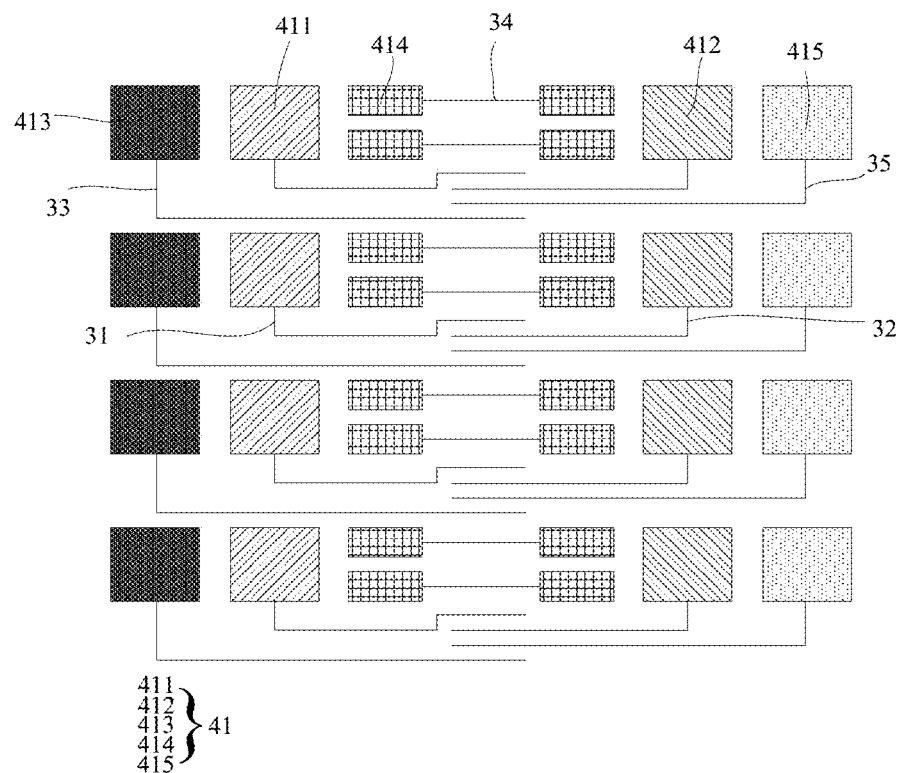
FIG. 14 is a fourth schematic diagram of the display panel provided by an embodiment of the present application.
Figure 15:
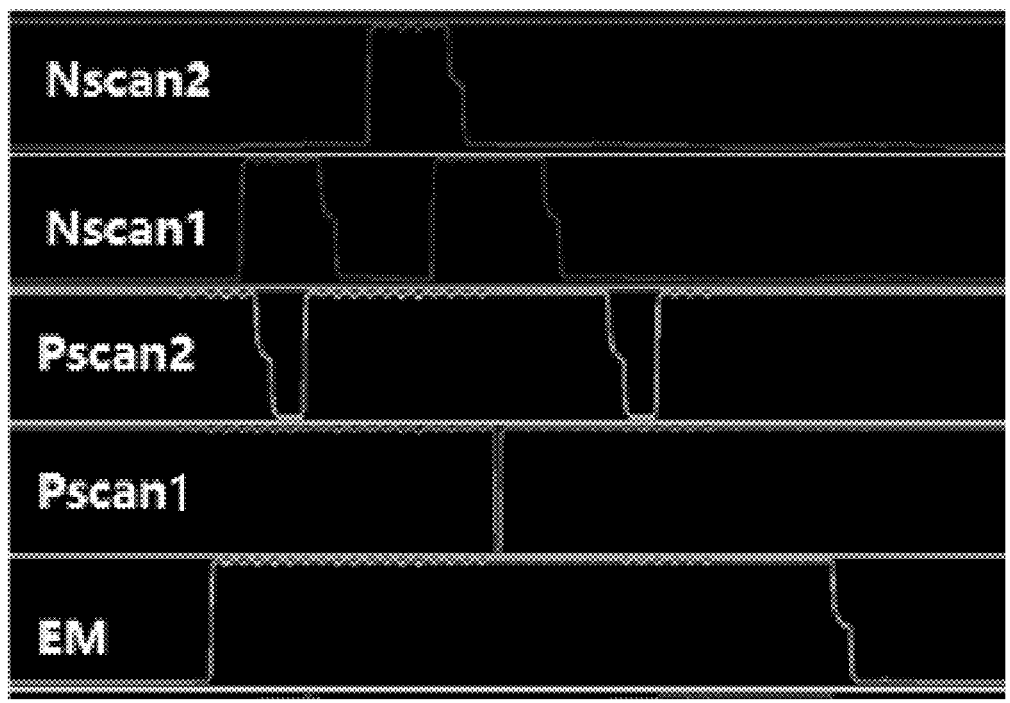
FIG. 15 is a timing diagram of a pixel driving circuit provided by an embodiment of the present application.

FIG. 1 is a circuit diagram of a display panel provided by an embodiment of the present application. FIG. 2 is a first schematic diagram of the display panel provided by an embodiment of the present application. FIG. 3 is a second schematic diagram of the display panel provided by an embodiment of the present application. FIG. 4 is a third schematic diagram of the display panel provided by an embodiment of the present application. FIG. 5 is a first schematic diagram of a first scanning signal line provided by an embodiment of the present application. (a) in FIG. 6 is an exploded diagram of a part of the first scanning signal line located in a first metal layer, and (b) in FIG. 6 is an exploded diagram of a part of the first scanning signal line located in a second metal layer. FIG. 7 is a first schematic diagram of a second scanning signal line provided by an embodiment of the present application. FIG. 8 is a second schematic diagram of the first scanning signal line provided by an embodiment of the present application. FIG. 9 is a second schematic diagram of the second scanning signal line provided by an embodiment of the present application. FIG. 10 is a first schematic diagram of an existing display device. FIG. 11 is a product diagram of the existing display device. FIG. 12 is a second schematic diagram of the existing display device. FIG. 13 is a brightness curve diagram of each row of pixels of the existing display device. FIG. 14 is a fourth schematic diagram of the display panel provided by an embodiment of the present application. FIG. 15 is a timing diagram of a pixel driving circuit provided by an embodiment of the present application.

Referring to FIG. 1 to FIG. 4, an embodiment of the present application provides a display panel 1 including a display area 11 and a hole-digging area 12. The display area 11 is disposed surrounding the hole-digging area 12. The display panel 1 includes a plurality of light-emitting devices LED arranged in an array and a pixel driving circuit driving the plurality of light-emitting devices LED. The pixel driving circuit includes:

a driving transistor T1;
a switching transistor T2, connected to the driving transistor T1 at a first node A;
a compensation transistor T3, connected to a first scanning signal line Nscan1, and the compensation transistor T3, the driving transistor T1, and the plurality of light-emitting devices LED are connected at a second node B; and a first initialization transistor T4, connected to a second scanning signal line Nscan2, the first initialization transistor T4, the driving transistor T1, and the compensation transistor T3 are connected at a third node Q.

At least part of the first scanning signal line 31 includes a first part 311 located at a left side of the hole-digging area 12, a second part 312 located at a right side of the hole-digging area 12, and a third part 313 connected to the first part 311 and the second part 312. An extension line of the first part 311 passes through the hole-digging area 12. And/or, at least part of the second scanning signal line 32 includes a fourth part 321 located at the left side of the hole-digging area 12, a fifth part 322 located at the right side of the hole-digging area 12, and a sixth part 322 connected to the fourth part 321 and the fifth part 322. An extension line of the fourth part 321 passes through the hole-digging area 12.

In the display panel provided by the embodiment of the present application, the first part and the second part of at least part of the first scanning signal line are connected through the third part, so that each first scanning signal line is wound from the left side of the hole-digging area to the right side of the hole-digging area alone, and an impedance of the first scanning signal line wound from the hole-digging area is similar to or even consistent with to an impedance of the first scanning signal line in other areas. And/or, the fourth part and the fifth part of at least part of the first scanning signal line are connected through the sixth part, so that each second scanning signal line is wound from the left side of the hole-digging area to the right side of the hole-digging area alone, and an impedance of the second scanning signal line wound from the hole-digging area is similar to or even consistent with to an impedance of the second scanning signal line in other areas. Therefore, a load of a hole-digging area is similar or even consistent with a load of other areas, thereby improving a display effect.

It should be noted that each structure is described by a circuit diagram and a film schematic diagram respectively in this present application. Therefore, one same structure may be denoted by different reference numerals. For example, the first scanning signal line may be denoted by reference numeral Nscan1 in the circuit diagram and 31 in the film diagram. It may be understood that both of the above reference numerals denote the first scanning signal line. Similarly, other structures existing in the circuit and film structure may also be referred to as the descriptions of the first scanning signal line, which will not be described in detail in following embodiments.

It should be noted that since the hole-digging area 12 is not provided with wirings, and some pixels are provided on the left sides and the right sides of the hole-digging area. The wirings of pixel rows corresponding to the hole-digging area will be wound from an upper side or a lower side of the hole-digging area to realize a normal display of the pixels. Specifically, the extension line of the first part 311 of the first scanning signal line 31 corresponding to the pixels may pass through the hole-digging area 12. By connecting the first part 311 and the second part 312 of the pixels in one-to-one correspondence through the third part 313, an impedance of the wirings of the pixel rows corresponding to the hole-digging area is similar or even consistent with an impedance of pixel rows corresponding to other areas, thereby improving a display uniformity of the display panel. Similarly, a design of the second scanning signal line 32 may be referred to the above descriptions of the first scanning signal line 31.

Specifically, as illustrated in FIG. 10, it may be seen that a phenomenon of split screen exists between the O-cut area and the other areas when displaying. In a current display device, as illustrated in FIG. 11 and FIG. 12, lines 49 to 114 are pixel rows corresponding to the O-cut area. In order to reduce a border of the O-cut area of the current display device, the lines of two adjacent rows of pixels in the pixel rows corresponding to the O-cut area may be connected, and one line is adopted to wind. However, in a verification process of products, as illustrated in FIG. 13, an abscissa in FIG. 13 is a number of rows, an ordinate is a normalized brightness, and the curve is a brightness change curve of odd lines of 600 nit G64 (64th gray scale). It may be seen from FIG. 13, a brightness of lines 49 to 113 is quite different from a brightness of other pixel rows, resulting in uneven display.

Specifically, for the pixel rows corresponding to the hole-digging area, compared with the current display device, after left side parts of the adjacent two rows of the first scanning signal lines are connected, the left side parts of the adjacent two rows of the first scanning signal lines are connected to right side parts of the adjacent two rows of the first scanning signal lines through a same wiring. In the embodiment of the present application, the first part 311 and the second part 312 of each row of the first scanning signal line are connected through the third part 313, so that the impedance of each row of the first scanning signal line 31 in the display panel is similar or even consistent, thereby improving the display uniformity of the display panel.

Specifically, for the pixel rows corresponding to the hole-digging area, compared with the current display device, after left side parts of the adjacent two rows of the second scanning signal lines are connected, the left side parts of the adjacent two rows of the second scanning signal lines are connected to right side parts of the adjacent two rows of the second scanning signal lines through a same wiring. In the embodiment of the present application, the fourth part 321 and the fifth part 322 of each row of the second scanning signal line are connected through the sixth part 323, so that the impedance of each row of the second scanning signal line 31 in the display panel is similar or even consistent, thereby improving the display uniformity of the display panel.

In one embodiment, when the first scanning signal line includes the first part located at the left side of the hole-digging area, the second part located at the right side of the hole-digging area, and the third part connected to the first part and the second part, and the extension line of the first part passes through the hole-digging area, after the left side parts of the adjacent two rows of the second scanning signal lines are connected, the left side parts of the adjacent two rows of the second scanning signal lines are connected to the right side parts of the adjacent two rows of the first scanning signal lines through the same wiring, so that the impedance of each row of the first scanning signal line in the display panel is similar or even consistent, thereby improving the display uniformity of the display panel. At a same time, the two adjacent rows of the second scanning signal lines are wound in the hole-digging area through the same wiring, so as to reduce the border of the hole-digging area and increase a screen proportion of the display panel.

In one embodiment, when the second scanning signal line includes the fourth part located at the left side of the hole-digging area, the fifth part located at the right side of the hole-digging area, and the sixth part connected to the fourth part and the fifth part, and the extension line of the fourth part passes through the hole-digging area, after the left side parts of the adjacent two rows of the first scanning signal lines are connected, the left side parts of the adjacent two rows of the first scanning signal lines are connected to the right side parts of the adjacent two rows of the first scanning signal lines through the same wiring, so that the impedance of each row of the second scanning signal line in the display panel is similar or even consistent, thereby improving the display uniformity of the display panel. At the same time, the two adjacent rows of the first scanning signal lines are wound in the hole-digging area through the same wiring, so as to reduce the border of the hole-digging area and increase the screen proportion of the display panel.

In one embodiment, as illustrated in FIG. 3 to FIG. 5, the display panel 1 includes:
- a substrate 21;
- a first active layer 241, disposed on a side of the substrate 21;
- a first metal layer 243, disposed on a side of the first active layer 241 away from the substrate 21;
- a second metal layer 245, disposed on a side of the first metal layer 243 away from the first active layer 241;
- a second active layer 247, disposed on a side of the second metal layer 245 away from the first metal layer 241; and
- a third metal layer 249, disposed on a side of the second active layer 247 away from the second metal layer 245.

The third part 313 is disposed in at least one of the first metal layer 243, the second metal layer 245, and the third metal layer 249, and the sixth part 323 is disposed in at least one of the first metal layer 243, the second metal layer 245, and the third metal layer 249. In the present application, by making that the third part is disposed in at least one of the first metal layer, the second metal layer, and the third metal layer, the third part may be connected to the first part and the second part in one-to-one correspondence, the impedance of each first scanning signal line is similar or even consistent, and the uniformity of the display panel is improved. The sixth part is disposed in at least one of the first metal layer, the second metal layer, and the third metal layer, so that the sixth part may be connected to the fourth part and the fifth part in one-to-one correspondence, the impedance of each second scanning signal line is similar or even consistent, and the uniformity of the display panel is improved.

In one embodiment, as illustrated in FIG. 5 and FIG. 6, the first part 311 includes a first sub-part 311a and a second sub-part 311b located in respective metal layers. The second part 312 includes a third sub-part 312a disposed in a same layer as the first sub-part 311a and a fourth sub-part 312b disposed in a same layer as the second sub-part 311b. The first sub-part 311a and the second sub-part 311b are connected to the third sub-part 312a and the fourth sub-part 312b through the third part 313. By making that the first part includes the first sub-part and the second sub-part located in respective metal layers, the second part includes the third sub-part disposed in the same layer as the first sub-part and the fourth sub-part disposed in the same layer as the second sub-part, and the first sub-part and the second sub-part are connected to the third sub-part and the fourth sub-part through the third part, so that the first scanning signal line may control two gate electrodes of the compensation transistor to improve a control capability of the compensation transistor. And the third part is connected to the first sub-part, the second sub-part, the third sub-part, and the fourth sub-part, so that the first scanning signal line may control the compensation transistor in one row of pixels.

Specifically, as illustrated in FIG. 3, FIG. 5, and FIG. 6, taking the first sub-part 311a is disposed in the first metal layer 243 and the second sub-part 311b is disposed in the second metal layer 245 as an example. The first sub-part 311a may be connected to a bottom gate electrode of the compensation transistor, and the second sub-part 311b may be connected to a top gate electrode of the compensation transistor, so as to control the compensation transistor.

Specifically, the first sub-part 311a, the second sub-part 311b, the third sub-part 312a, and the fourth sub-part 312b are connected through the third part, so that a potential of each part of the first scanning signal line is consistent.

In view of the technical problem that an impedance of signal lines in the O-cut area is inconsistent with an impedance of signal lines in other areas, resulting in uneven display. In one embodiment, as illustrated in FIG. 4 to FIG. 6, the third part 313 and one of the first sub-part 311a and the second sub-part 311b are disposed in a same layer. At a junction of the hole-digging area 12 and the display area 11, the first sub-part 311a is connected to the second sub-part 311b, the third sub-part 312a is connected to the fourth sub-part 312b, and the first sub-part 311a is connected to the third sub-part 312a through the third part 313. By making that the first sub-part is connected to the second sub-part, the third sub-part is connected to the fourth sub-part, and the first sub-part is connected to the third sub-part through the third part, when the first scanning signal line is wound from the hole-digging area, each part of the first scanning signal line may be connected together, so that the potential of each part is consistent. The third part is disposed in the same layer as one of the first sub-part and the second sub-part, so that the third part merely occupies one layer of metal, thereby reducing the border of the hole-digging area and improving the screen proportion of the display panel.

Specifically, when the sub-parts of different layers are connected, the sub-parts may be connected by connecting wires of other layers. As illustrated in FIG. 5, joints of different metal layers are denoted by reference number 51. For example, when the first sub-part 311a is disposed in the first metal layer, the second sub-part 311b is disposed in the second metal layer, and the third part 313 is disposed in the first metal layer, the third part 313 may be directly connected to the first sub-part 311a. At the same time, first connecting parts 314 are provided, so that the first connecting parts 314 is connected to the third part 313 through a through hole, and the first connecting parts 314 is connected to the second sub-part 311b through a through hole. However, the embodiments of this present application are not limited to this, for example, the connecting parts 314 connect the first sub-part, the second sub-part, and the third part through through holes respectively. For example, without providing the connecting parts, the first sub-part 311a is disposed in the first metal layer, the second sub-part 311b is disposed in the second metal layer, and the third part 313 is disposed in the second metal layer, so that the second sub-part 311b is connected to the first sub-part 311a through a through hole, the fourth sub-part 312b is connected to the third sub-part 312a through a through hole, and the third part 313 is connected to the first sub-part 311a and the third sub-part 312a through a through hole. For example, without providing the connecting parts, the third part is directly connected to the second sub-part and the fourth sub-part, the second sub-part is directly connected to the first sub-part through a through hole, and the fourth sub-part is directly connected to the third sub-part through a through hole, so that the number of the through holes is reduced, a preparation efficiency of the display panel is improved, and the impedance of the first scanning signal line is reduced. For connection ways of other sub-parts or other parts, connection ways of the first sub-part and the second sub-part, as well as connection ways of the third sub-part and the first sub-part mentioned above may be referred, which will not be repeated in the following embodiments.

Specifically, the first connecting parts may be disposed in a first source-drain layer.

Specifically, in order to distinguish the third part from other sub-parts, FIG. 5 illustrates that a line width of the third part is less than a line width of the other sub-parts, which is not limited in the embodiments of the present application. For example, the line width of the third part may be greater than or equal to the line width of the other sub-parts.

In one embodiment, the third part is disposed in the first metal layer, or the third part is disposed in the second metal layer, or the third part is disposed in the third metal layer.

Specifically, when the third part is disposed in the first metal layer, one of the first sub-part and the second sub-part may be disposed in the first metal layer, and the first sub-part may be disposed in the second metal layer, and the second sub-part may be disposed in the third metal layer. Similarly, when the third part is disposed in the second metal layer or the third metal layer, one of the first sub-part and the second sub-part may be disposed in the same layer as the third part, or the first sub-part and the second sub-part may be disposed in different layers from the third part.

Specifically, since the bottom gate electrode of the compensation transistor is disposed in the second metal layer, and the top gate electrode of the compensation transistor is disposed in the third metal layer, the first sub-part may be disposed in the second metal layer and the second sub-part may be disposed in the third metal layer, so that the first sub-part is directly connected to the bottom gate electrode and the second sub-part is directly connected to the top gate electrode.

Specifically, when the third part is disposed the same layer as one of the first sub-part and the second sub-part, for example, for example, the third part and the second sub-part are disposed in the same layer, the second sub-part, the third part, and the fourth sub-part may be formed simultaneously without etching metal wrings to form the second sub-part, the third part, and the fourth sub-part respectively, thereby improving the preparation efficiency of the display panel.

Specifically, FIG. 5, FIG. 7, FIG. 8, and FIG. 9 show that there are joints or boundaries between the parts or the sub-parts to distinguish different parts conveniently. However, it may be understood that when the parts or the sub-parts are disposed in the same layer, there may be no joints or boundaries between the parts or sub-parts. For example, if the first sub-part 311a and the third part 313 are disposed in the same layer, the first sub-part 311a and the third part 313 are two parts of the same metal wiring, and there is no need to provide the joints or the boundaries. Similarly, for other parts and other sub-parts, there may be no joints or boundaries.

In view of a problem still existing that the impedance of the first sub-part and the second sub-part connected to the same wring is inconsistent with the impedance of the signal lines in other areas. In one embodiment, as illustrated in FIG. 8, the third part 313 includes a fifth sub-part 313a disposed in a same layer as the first sub-part 311a and a sixth sub-part 313b disposed in a same layer as the second sub-part 311b. The first sub-part 311a is connected to the third sub-part 312a through the fifth sub-part 313a. The second sub-part 311b is connected to the fourth sub-part 312b through the sixth sub-part 313b. By making that the third part includes the fifth sub-part and the sixth sub-part, the first sub-part is connected to the third sub-part through the fifth sub-part, and the second sub-part is connected to the fourth sub-part through the sixth sub-part, each layer of the first scanning signal line is wound from the hole-digging area separately, and the first scanning signal line corresponding to the hole-digging area and the first scanning signal line in the other areas are connected one by one, so that the impedance of the first scanning signal line corresponding to the hole-digging area is similar or even consistent with the impedance of the first scanning signal line in the other areas, thereby improving a yield of the display panel.

In one embodiment, the fifth sub-part is disposed in the first metal layer, and the sixth sub-part is disposed in the second metal layer. Or the fifth sub-part is disposed in the first metal layer, and the sixth sub-part is disposed in the third metal layer. Or the fifth sub-part is disposed in the second metal layer, and the sixth sub-part is disposed in the third metal layer.

Specifically, when the fifth sub-part and the sixth sub-part are provided, the fifth sub-part may be disposed in one of the first metal layer, the second metal layer, and the third metal layer, and the sixth sub-part may be disposed in the other of the first metal layer, the second metal layer, and the third metal layer. Correspondingly, the first sub-part may be disposed in the same layer as the fifth sub-part, and the second sub-part may be disposed in the same layer as the sixth sub-part, thereby reducing process steps of the display panel and improving the preparation efficiency of the display panel.

In one embodiment, a projection of the fifth sub-part on the substrate is not overlapped with a projection of the sixth sub-part on the substrate.

In one embodiment, a projection of the first sub-part on the substrate is not overlapped with a projection of the second sub-part on the substrate.

In one embodiment, a projection of the third sub-part on the substrate is not overlapped with a projection of the fourth sub-part on the substrate.

In view of a problem that the fifth sub-part is not overlapped with the sixth sub-part, resulting in a larger border of the display panel. In one embodiment, the projection of the fifth sub-part on the substrate is overlapped with the projection of the sixth sub-part on the substrate. By making that the projection of the fifth sub-part on the substrate is overlapped with the projection of the sixth sub-part on the substrate, so that a space occupied by the fifth sub-part and the sixth sub-part is small, thereby avoiding increasing the border of the hole-digging area and improving the display effect.

Specifically, the projection of the fifth sub-part on the substrate coincides with the projection of the sixth sub-part on the substrate.

Specifically, the projection of the first sub-part on the substrate is overlapped with the projection of the second sub-part on the substrate, and the projection of the third sub-part on the substrate is overlapped with the projection of the fourth sub-part on the substrate, so that a space occupied by each first scanning signal line is small, a resolution of the display panel is improved, and the screen proportion of the display panel is improved.

In one embodiment, referring to FIG. 9, the fourth part 321 includes a seventh sub-part 321a and an eighth sub-part 321b located in respective metal layers. The fifth part 322 includes a ninth sub-part 322a disposed in a same layer as the seventh sub-part 321a and a tenth sub-part 322b disposed in a same layer as the eighth sub-part 321b. The seventh sub-part 321a and the eighth sub-part 321b are connected to the ninth sub-part 322a and the tenth sub-part 322b through the sixth part. By making that the fourth part includes the seventh sub-part and the eighth sub-part located in respective metal layers. The fifth part includes the ninth sub-part disposed in the same layer as the seventh sub-part and the tenth sub-part disposed in the same layer as the eighth sub-part, so that the second scanning signal line may control two gate electrodes of the first initialization transistor to improve a control capability of the first initialization transistor. And the sixth part is connected to the seventh sub-part, the eighth sub-part, the ninth sub-part, and the tenth sub-part, so that the second scanning signal line may control the first initialization transistor in one row of pixels.

Specifically, as illustrated in FIG. 3 and FIG. 7, taking the seventh sub-part 321a is disposed in the first metal layer 243 and the eighth sub-part 321b is disposed in the second metal layer 245 as an example. The seventh sub-part 321a may be connected to a bottom gate electrode of the first initialization transistor, and the eighth sub-part 321b may be connected to a top gate electrode of the first initialization transistor, thereby controlling the first initialization transistor.

Specifically, the seventh sub-part 321a, the eighth sub-part 321b, the ninth sub-part 322a, and the tenth sub-part 322b are connected through the sixth part, so that a potential of each part of the second scanning signal line is consistent.

In view of the technical problem that the impedance of the signal lines in the O-cut area is inconsistent with the impedance of the signal lines in the other areas, resulting in uneven display. In one embodiment, as illustrated in FIG. 4 and FIG. 7, the sixth part 323 and one of the seventh sub-part 321a and the eighth sub-part 321b are disposed in a same layer. At the junction of the hole-digging area 12 and the display area 11, the seventh sub-part 321a is connected to the eighth sub-part 321b, the ninth sub-part 322a is connected to the tenth sub-part 322b, and the seventh sub-part 321a is connected to the ninth sub-part 322a through the sixth part 323. By making that the seventh sub-part is connected to the eighth sub-part, the ninth sub-part is connected to the tenth sub-part, and the seventh sub-part is connected to the ninth sub-part through the sixth part, when the second scanning signal line is wound from the hole-digging area, each part of the second scanning signal line may be connected together, so that the potential of each part is consistent. The sixth part is disposed in the same layer as one of the seventh sub-part and the eighth sub-part, so the sixth part merely occupies one layer of metal, thereby reducing the border of the hole-digging area and improving the screen proportion of the display panel.

Specifically, when the sub-parts of different layers are connected, the sub-parts may be connected by the connecting wires of other layers. As illustrated in FIG. 7, for example, when the seventh sub-part 321a is disposed in the first metal layer, the eighth sub-part 321b is disposed in the second metal layer, and the sixth part 323 is disposed in the first metal layer, the sixth part 323 may be directly connected to the seventh sub-part 321a. At the same time, second connecting parts 324 are provided, so that the second connecting parts 324 is connected to the sixth part 323 through a through hole, and the second connecting parts 324 is connected to the eighth sub-part 321b through a through hole. However, the embodiments of this present application are not limited to this, for example, the connecting parts 324 is connected to the seventh sub-part, the eighth sub-part, and the sixth part through the through holes respectively. For example, without providing the connecting parts, the seventh sub-part 321a is disposed in the first metal layer, the eighth sub-part 321b is disposed in the second metal layer, and the sixth part 313 is disposed in the second metal layer, the eighth sub-part 321b is connected to the seventh sub-part 321a through a through hole, the tenth sub-part 322b is connected to the ninth sub-part 322a through a through hole, and the sixth part 323 is connected to the seventh sub-part 321a and the ninth sub-part 312a through a through hole. For example, without providing the connecting For example, without providing the connecting parts, the sixth part is directly connected to the seventh sub-part and the eighth sub-part, the eighth sub-part is directly connected to the seventh sub-part through a through hole, and the tenth sub-part is directly connected to the ninth sub-part through a through hole, so that the number of the through holes is reduced, the preparation efficiency of the display panel is improved, and the impedance of the second scanning signal line is reduced.

Specifically, the second connecting parts may be disposed in the first source-drain layer.

Specifically, in order to distinguish the sixth part from the other sub-parts, FIG. 7 illustrates that a line width of the sixth part is less than a line width of the other sub-parts, which is not limited in the embodiments of the present application. For example, the line width of the sixth part may be greater than or equal to the line width of the other sub-parts.

In one embodiment, the sixth part is disposed in the first metal layer, or the sixth part is disposed in the second metal layer, or the sixth part is disposed in the third metal layer.

Specifically, when the sixth part is disposed in the first metal layer, one of the seventh sub-part and the eighth sub-part may be disposed in the first metal layer, the seventh sub-part may be disposed in the second metal layer, and the eighth sub-part may be disposed in the third metal layer. Similarly, when the sixth part is disposed in the second metal layer or the third metal layer, one of the first sub-part and the second sub-part may be disposed in the same layer as the sixth part, or the seventh sub-part and the eighth sub-part may be disposed in different layers from the sixth part.

Specifically, since the bottom gate electrode is disposed in the second metal layer and the top gate electrode of the first initialization transistor is disposed in the third metal layer, the seventh sub-part may be disposed in the second metal layer and the eighth sub-part may be disposed in the third metal layer, so that the seventh sub-part is directly connected to the bottom gate electrode and the eighth sub-part is directly connected to the top gate electrode.

Specifically, when the sixth part is disposed the same layer as one of the seventh sub-part and the eighth sub-part, for example, when the sixth part and the seventh sub-part are disposed in the same layer, the seventh sub-part, the sixth part, and the ninth sub-part may be formed simultaneously without etching the metal wrings to form the seventh sub-part, the sixth part, and the ninth sub-part respectively, thereby improving the preparation efficiency of the display panel.

In view of a problem still existing that an impedance of the seventh sub-part and the eighth sub-part connected to the same wring is inconsistent with the impedance of the signal lines in the other areas. In one embodiment, as illustrated in FIG. 9, the sixth part 323 includes an eleventh sub-part 323a disposed in a same layer as the seventh sub-part 321a and a twelfth sub-part 323b disposed in a same layer as the eighth sub-part 321b. The seventh sub-part 321a is connected to the ninth sub-part 322a through the eleventh sub-part 323a, and the eighth sub-part 321b is connected to the tenth sub-part 323b through the twelfth sub-part 322b. By making that the sixth part includes the eleventh sub-part and the twelfth sub-part, the seventh sub-part is connected to the ninth sub-part through the eleventh sub-part, and the eighth sub-part is connected to the tenth sub-part through the twelfth sub-part, each layer of the second scanning signal line is wound from the hole-digging area separately, and the second scanning signal line corresponding to the hole-digging area and the second scanning signal line in the other areas are connected one by one, so that the impedance of the second scanning signal line corresponding to the hole-digging area is similar or even consistent with the impedance of the second scanning signal line in the other areas, thereby improving the yield of the display panel.

In one embodiment, the eleventh sub-part is disposed in the first metal layer, and the twelfth sub-part is disposed in the second metal layer. Or the eleventh sub-part is disposed in the first metal layer, and the twelfth sub-part is disposed in the third metal layer. Or the eleventh sub-part is disposed in the second metal layer, and the twelfth sub-part is disposed in the third metal layer.

Specifically, when the eleventh sub-part and the twelfth sub-part are provided, the eleventh sub-part may be disposed in one layer of the first metal layer, the second metal layer, and the third metal layer, and the twelfth sub-part may be disposed in another layer of the first metal layer, the second metal layer, and the third metal layer. Correspondingly, the seventh sub-part may be disposed in the same layer as the eleventh sub-part, and the eighth sub-part may be disposed in the same layer as the twelfth sub-part, thereby reducing the process steps of the display panel and improving the preparation efficiency of the display panel.

In one embodiment, a projection of the eleventh sub-part on the substrate is not overlapped with a projection of the twelfth sub-part on the substrate.

In one embodiment, a projection of the seventh sub-part on the substrate is not overlapped with a projection of the eighth sub-part on the substrate.

In one embodiment, a projection of the ninth sub-part on the substrate is not overlapped with a projection of the tenth sub-part on the substrate.

In view of a problem that the eleventh sub-part is not overlapped with the twelfth sub-part, resulting in a larger border of the display panel. In one embodiment, the projection of the eleventh sub-part on the substrate is overlapped with the projection of the twelfth sub-part on the substrate. By making that the projection of the eleventh sub-part on the substrate is overlapped with the projection of the twelfth sub-part on the substrate, so that a space occupied by the eleventh sub-part and the twelfth sub-part is small, thereby avoiding increasing the border of the hole-digging area and improving the display effect.

Specifically, the projection of the eleventh sub-part on the substrate coincides with the projection of the twelfth sub-part on the substrate.

Specifically, the projection of the seventh sub-part on the substrate is overlapped with the projection of the eighth sub-part on the substrate, and the projection of the ninth sub-part on the substrate is overlapped with the projection of the tenth sub-part on the substrate, so that a space occupied by each second scanning signal line is small, the resolution of the display panel is improved, and the screen proportion of the display panel is improved.

In view of a problem that each scanning signal line is separately connected to gate driving units, resulting in a large border of the display panel. In one embodiment, referring to FIG. 4, the display panel further includes gate driving units 41. The gate driving units 41 include first gate driving units 411 and second gate driving units 412. Two adjacent rows of first scanning signal lines 31 are connected to a same one of the first gate driving units 411, and two adjacent rows of the second scanning signal lines 32 are connected to a same one of the second gate driving units 412. By making that the two adjacent rows of first scanning signal lines are connected to the same one of the first gate driving units, and the two adjacent rows of the second scanning signal lines are connected to the same one of the second gate driving units 412, a space occupied by the gate driving units may be reduced and the border of the display panel may be reduced.

Specifically, taking the display panel as an organic light-emitting diode (OLED) display panel, the display screen is 600 nits and the 64th gray scale, and taking three different pixels connected by the first scanning signal line corresponding to the hole-digging area as an example, a current of the current display device is compared with a current of the display panel of the embodiments of the present application, and a distance between the three pixels and the first gate driving units may be 0, ½ of a width of the display area, and the width of the display area respectively.

Specifically, the solution of the current display device is defined as a first solution. In the embodiments of the present application, except that the third part is disposed in the same layer as one of the first sub-part and the second sub-part, the first sub-part is connected to the second sub-part at the junction of the hole-digging area and the display area, the third sub-part is connected to the fourth sub-part, and the first sub-part is connected to the third sub-part through the third part, and other solutions with the same design as the current display device is defined as a second solution. In the embodiments of the present application, except that the third part includes a fifth subpart and a sixth subpart disposed in the same layer as the first sub-part and the second sub-part respectively, the first sub-part is connected to the third sub-part through the fifth sub-part, and the second sub-part is connected to the fourth sub-part through the sixth sub-part, other solutions with the same design as the current display device is defined as a third solution.

Specifically, simulation results show that in the first solution, light-emitting currents of from a first pixel, a second pixel and a third pixel in a direction away from the first gate driving unit to a direction adjacent to the first gate driving unit are 950.5 picoamperes, 939.5 picoamperes, and 895.4 picoamperes respectively. In the second solution, light-emitting currents from the first pixel to the third pixel in the direction away from the first gate driving unit to the direction adjacent to the first gate driving unit are 976 picoamperes, 981 picoamperes, and 902 picoamperes respectively. In the third solution, light emitting currents from the first pixel to the third pixel in the direction away from the first gate driving unit to the direction adjacent to the first gate driving unit are 975.4 picoamperes, 986.7 picoamperes, and 900.9 picoamperes respectively. The light-emitting currents of the pixels in other areas are similar or even consistent with the light-emitting currents of the third solution. It may be seen that the light-emitting currents of the pixels corresponding to the O-cut area in the current display device are inconsistent with the light-emitting currents of the pixels in other areas, resulting in uneven display. However, the present application may make the light-emitting currents of the pixels corresponding to the hole-digging area similar or even consistent with the light-emitting currents of the pixels in other areas, thereby improving the display effect.

In one embodiment, as illustrated in FIG. 1, the first initialization transistor T4 is connected to the first initialization signal line Vi1.

In one embodiment, as illustrated in FIG. 1, a gate electrode of the switching transistor T2 is connected to a third scanning signal line Pscan1, and a first electrode of the switching transistor T2 is connected to a data signal line Data.

In one embodiment, as illustrated in FIG. 1, the pixel driving circuit further includes a second initialization transistor T7. A first electrode of the second initialization transistor T7 is connected to a second initialization signal line Vi2. A second electrode of the second initialization transistor T7 is connected to the light-emitting device LED at a fourth node C. A gate electrode of the second initialization transistor T7 is connected to the fourth scanning signal line Pscan2.

A first light-emitting controlling transistor T5 is connected to the driving transistor T1 through the first node A, and the first light-emitting controlling transistor T5 is connected to a light-emitting controlling signal line EM.

A second light-emitting controlling transistor T6 is connected to the driving transistor T1 through the second node B.

A third light-emitting controlling transistor T8 is connected to a third initialization signal line Vi3.

In one embodiment, as illustrated in FIG. 1, the light-emitting device LED is connected to a low potential power signal line VSS.

In one embodiment, as illustrated in FIG. 1, the pixel driving circuit further includes a storage capacitor Cst and a boosting capacitor Cboost. An end of the storage capacitor Cst is connected to a high potential power signal line VDD, and another end of the storage capacitor Cst is connected to the third node Q. An end of the boost capacitor Cboost is connected to the gate electrode of the switching transistor T2, and another end of the boost capacitor Cboost is connected to the third node Q.

Specifically, as illustrated in FIG. 14, the gate driving units 41 further include third gate driving units 413, fourth gate driving units 414, and fifth gate driving units 415. Two adjacent rows of light-emitting controlling signal lines 33 are connected to a same one of the third gate driving unit 413, one row of third scanning signal line 34 is connected to two fourth gate driving units, and two adjacent rows of fourth scanning signal lines 35 are connected to a same one of the fifth gate driving units.

Specifically, as illustrated in FIG. 14 and FIG. 15, the first light-emitting controlling transistor T5 and the second light-emitting controlling transistor T6 are controlled by the light-emitting controlling signal line EM. The compensation transistor T3 is controlled by the first scanning signal line Nscan1. The first initialization transistor T4 is controlled by the second scanning signal line Nscan2. The switching transistor T2 is controlled by the third scanning signal line Pscan1, and the second initialization transistor T7 and the third initialization transistor T8 are controlled by the fourth scanning signal line Pscan2, thereby realizing normal operation of the display panel.

In one embodiment, as illustrated in FIG. 3, the display panel further includes a light shielding layer 22, a buffer layer 23, a first gate insulating layer 242, a second gate insulating layer 244, a third gate insulating layer 246, a fourth gate insulating layer 248, a first interlayer insulating layer 251, the first source-drain layer 252, a second interlayer insulating layer 253, a second source-drain layer 254, a third interlayer insulating layer 255, a third source-drain layer 256, a planarization layer 257, a pixel electrode layer 261, a pixel defining layer 262, a light-emitting material layer 263, a common electrode layer 264, and a packaging layer 27.

Specifically, the design of the first scanning signal line and the design of the second scanning signal line are respectively described in the above-mentioned embodiments. It may be understood that when there is no conflict among the embodiments, the embodiments may be combined to achieve better effects. For example, the third part includes the fifth sub-part disposed in the same layer as the first sub-part and the sixth sub-part disposed in the same layer as the second sub-part, the first sub-part is connected to the third sub-part through the fifth sub-part, and the second sub-part is connected to the fourth sub-part through the sixth sub-part. After the left side parts of the adjacent two rows of the second scanning signal lines are connected, the left side parts of the adjacent two rows of the second scanning signal lines are connected to the right side parts of the adjacent two rows of the second scanning signal lines through the same wiring. For example, the third part includes the fifth sub-part disposed in the same layer as the first sub-part and the sixth sub-part disposed in the same layer as the second sub-part, the first sub-part is connected to the third sub-part through the fifth sub-part, and the second sub-part is connected to the fourth sub-part through the sixth sub-part. The sixth part includes the eleventh sub-part disposed in the same layer as the seventh sub-part and the twelfth sub-part disposed in the same layer as the eighth sub-part, the seventh sub-part is connected to the ninth sub-part through the eleventh sub-part, and the eighth sub-part is connected to the tenth sub-part through the twelfth sub-part.

At the same time, the embodiment of the present application provides a display device including a display panel as described in any of the above embodiments.

According to the above embodiments:

The display panel and the display device are provided by the present application. The display panel includes the display area and the hole-digging area. The display area is disposed surrounding the display area. The display area includes the plurality of light-emitting devices arranged in the array and the pixel driving circuit driving the plurality of light-emitting devices. The pixel driving circuit includes the driving transistor, the switching transistor, and the compensation transistor. The gate electrode of the driving transistor is connected to the first node. The first electrode of the driving transistor is connected to the second node. The driving transistor is configured to drive the plurality of light-emitting devices to emit light under a control of potentials of the first node and the second node. The gate electrode of the switching transistor is connected to the first scanning signal line. The switching transistor is configured to input a data signal to the second node under the control of the first scanning signal. The gate electrode of the compensation transistor is connected to the first scanning signal line. The first electrode of the compensation transistor is connected to the driving transistor through the first node, and the second electrode of the compensation transistor is connected to the driving transistor through the third node. The switching transistor is configured to compensate a threshold voltage of the driving transistor under the control of the second scanning signal. The gate electrode of the first initialization transistor is connected to the second scanning signal line, and the first initialization transistor is configured to input a first initialization signal to the first node under a control of a third scanning signal. Part of the first scanning signal line includes the first part located at the left side of the hole-digging area, the second part located at the right side of the hole-digging area, and the third part connected to the first part and the second part. The extension line of the first part passes through the hole-digging area. And/or, part of the second scanning signal line includes the fourth part located at the left side of the hole-digging area, the fifth part located at the right side of the hole-digging area, and the sixth part connected to the fourth part and the fifth part. The extension line of the fourth part passes through the hole-digging area. In the present application, by making that the first part and the second part of the part of the first scanning signal line are connected through the third part, each first scanning signal line is wound from the left side of the hole-digging area to the right side of the hole-digging area alone, and an impedance of the first scanning signal line wound from the hole-digging area is similar to or even consistent with to an impedance of the first scanning signal line in other areas. And/or, the fourth part and And/or, the fourth part and fifth part of the at least part of the first scanning signal line are connected through the sixth part, so that each second scanning signal line is wound from the left side of the hole-digging area to the right side of the hole-digging area alone, and the impedance of the second scanning signal line wound from the hole-digging area is similar to or even consistent with to the impedance of the second scanning signal line in other areas. Therefore, the load of a hole-digging area is similar or even consistent with the load of other areas, thereby improving a display effect.

In the foregoing embodiments, the description of each of the embodiments has respective focuses. For a part that is not described in detail in an embodiment, reference may be made to relevant descriptions in other embodiments. Details are not further described herein.

The display panel and the display device provided by the embodiments of the present application are described in detail above, and the principle and implementation mode of the present application are described by using specific examples in this paper. The description about the foregoing embodiments is merely provided to help understand the method and core ideas of the present application. In addition, persons of ordinary skill in the art can make modifications in terms of the specific implementations and application scopes according to the ideas of the present application. Therefore, the content of this specification shall not be construed as a limit to the present application.

What is claimed is:

1. A display panel, comprising a display area and a hole-digging area surrounded by the display area, wherein the display panel comprises a plurality of light-emitting devices arranged in an array and a pixel driving circuit driving the plurality of light-emitting devices, and the pixel driving circuit comprises:
   a driving transistor;
   a switching transistor, connected to the driving transistor at a first node;
   a compensation transistor, connected to a first scanning signal line, wherein the compensation transistor, the driving transistor, and the plurality of light-emitting devices are connected at a second node; and
   a first initialization transistor, connected to a second scanning signal line, wherein the first initialization transistor, the driving transistor, and the compensation transistor are connected at a third node;
   wherein part of the first scanning signal line comprises a first part located at a left side of the hole-digging area, a second part located at a right side of the hole-digging area, and a third part connected to the first part and the second part, and an extension line of the first part passes through the hole-digging area; and/or, part of the second scanning signal line comprises a fourth part located at the left side of the hole-digging area, a fifth part located at the right side of the hole-digging area, and a sixth part connected to the fourth part and the fifth part, and an extension line of the fourth part passes through the hole-digging area; and
   the display panel further comprising:
   a substrate;
   a first active layer, disposed on a side of the substrate;
   a first metal layer, disposed on a side of the first active layer away from the substrate;
   a second metal layer, disposed on a side of the first metal layer away from the first active layer;
   a second active layer, disposed on a side of the second metal layer away from the first metal layer; and
   a third metal layer, disposed on a side of the second active layer away from the second metal layer;
   wherein the third part is disposed in at least one of the first metal layer, the second metal layer, and the third metal layer, and the sixth part is disposed in at least one of the first metal layer, the second metal layer, and the third metal layer.

2. The display panel according to claim 1, wherein the first part comprises a first sub-part and a second sub-part located in respective metal layers; the second part comprises a third sub-part disposed in a same layer as the first sub-part and a fourth sub-part disposed in a same layer as the second sub-part; and the first sub-part and the second sub-part are connected to the third sub-part and the fourth sub-part through the third part.

3. The display panel according to claim 2, wherein the third part and one of the first sub-part and the second sub-part are disposed in a same layer; at a junction of the hole-digging area and the display area, the first sub-part is connected to the second sub-part, the third sub-part is connected to the fourth sub-part, and the first sub-part is connected to the third sub-part through the third part.

4. The display panel according to claim 3, wherein the third part is disposed in the first metal layer, or the third part is disposed in the second metal layer, or the third part is disposed in the third metal layer.

5. The display panel according to claim 2, wherein the third part comprises a fifth sub-part disposed in a same layer as the first sub-part and a sixth sub-part disposed in a same layer as the second sub-part; the first sub-part is connected to the third sub-part through the fifth sub-part, and the second sub-part is connected to the fourth sub-part through the sixth sub-part.

6. The display panel according to claim 5, wherein the fifth sub-part is disposed in the first metal layer, and the sixth sub-part is disposed in the second metal layer; or the fifth sub-part is disposed in the first metal layer, and the sixth sub-part is disposed in the third metal layer; or the fifth sub-part is disposed in the second metal layer, and the sixth sub-part is disposed in the third metal layer.

7. The display panel according to claim 5, wherein a projection of the fifth sub-part on the substrate is overlapped with a projection of the sixth sub-part on the substrate.

8. The display panel according to claim 1, wherein the fourth part comprises a seventh sub-part and an eighth sub-part located in respective metal layers; the fifth part comprises a ninth sub-part disposed in a same layer as the seventh sub-part and a tenth sub-part disposed in a same layer as the eighth sub-part, and the seventh sub-part and the eighth sub-part are connected to the ninth sub-part and the tenth sub-part through the sixth part.

9. The display panel according to claim 8, wherein the sixth part and one of the seventh sub-part and the eighth sub-part are disposed in a same layer; at a junction of the hole-digging area and the display area, the seventh sub-part is connected to the eighth sub-part, the ninth sub-part is connected to the tenth sub-part, and the seventh sub-part is connected to the ninth sub-part through the sixth part.

10. The display panel according to claim 9, wherein the sixth part is disposed in the first metal layer, or the sixth part is disposed in the second metal layer, or the sixth part is disposed in the third metal layer.

11. The display panel according to claim 8, wherein the sixth part comprises an eleventh sub-part disposed in a same layer as the seventh sub-part and a twelfth sub-part disposed in a same layer as the eighth sub-part, the seventh sub-part is connected to the ninth sub-part through the eleventh sub-part, and the eighth sub-part is connected to the tenth sub-part through the twelfth sub-part.

12. The display panel according to claim 11, wherein the eleventh sub-part is disposed in the first metal layer, and the twelfth sub-part is disposed in the second metal layer; or the eleventh sub-part is disposed in the first metal layer, and the twelfth sub-part is disposed in the third metal layer; or the eleventh sub-part is disposed in the second metal layer, and the twelfth sub-part is disposed in the third metal layer.

13. The display panel according to claim 1, wherein a projection of the eleventh sub-part on the substrate is overlapped with a projection of the twelfth sub-part on the substrate.

14. The display panel according to claim 1, further comprising:
gate driving units, comprising first gate driving units and second gate driving units, wherein two adjacent rows of first scanning signal lines are connected to a same one of the first gate driving units, and two adjacent rows of the second scanning signal lines are connected to a same one of the second gate driving units.

15. The display panel according to claim 2, wherein a projection of the first sub-part on the substrate is overlapped with a projection of the second sub-part on the substrate, and a projection of the third sub-part on the substrate is overlapped with a projection of the fourth sub-part on the substrate.

16. A display device, comprising a display panel comprising a display area and a hole-digging area surrounded by the display area, wherein the display panel comprises a plurality of light-emitting devices arranged in an array and a pixel driving circuit driving the plurality of light-emitting devices, and the pixel driving circuit comprises:
a driving transistor;
a switching transistor, connected to the driving transistor at a first node;
a compensation transistor, connected to a first scanning signal line, wherein the compensation transistor, the driving transistor, and the plurality of light-emitting devices are connected at a second node; and
a first initialization transistor, connected to a second scanning signal line, wherein the first initialization transistor, the driving transistor, and the compensation transistor are connected at a third node;
wherein part of the first scanning signal line comprises a first part located at a left side of the hole-digging area, a second part located at a right side of the hole-digging area, and a third part connected to the first part and the second part, and an extension line of the first part passes through the hole-digging area; and/or, part of the second scanning signal line comprises a fourth part located at the left side of the hole-digging area, a fifth part located at the right side of the hole-digging area, and a sixth part connected to the fourth part and the fifth part, and an extension line of the fourth part passes through the hole-digging area; and
wherein the display panel further comprises:
a substrate;
a first active layer, disposed on a side of the substrate;
a first metal layer, disposed on a side of the first active layer away from the substrate;
a second metal layer, disposed on a side of the first metal layer away from the first active layer;
a second active layer, disposed on a side of the second metal layer away from the first metal layer; and
a third metal layer, disposed on a side of the second active layer away from the second metal layer;
wherein the third part is disposed in at least one of the first metal layer, the second metal layer, and the third metal layer, and the sixth part is disposed in at least one of the first metal layer, the second metal layer, and the third metal layer.

17. The display device according to claim 16, wherein the first part comprises a first sub-part and a second sub-part located in respective metal layers;
the second part comprises a third sub-part disposed in a same layer as the first sub-part and a fourth sub-part disposed in a same layer as the second sub-part, and the first sub-part and the second sub-part are connected to the third sub-part and the fourth sub-part through the third part.

18. The display device according to claim 17, wherein the third part and one of the first sub-part and the second sub-part are disposed in a same layer; at a junction of the hole-digging area and the display area, the first sub-part is connected to the second sub-part, the third sub-part is connected to the fourth sub-part, and the first sub-part is connected to the third sub-part through the third part.

19. The display device according to claim 18, wherein the third part is disposed in the first metal layer, or the third part is disposed in the second metal layer, or the third part is disposed in the third metal layer.

20. The display device according to claim 17, wherein a projection of the first sub-part on the substrate is overlapped with a projection of the second sub-part on the substrate, and a projection of the third sub-part on the substrate is overlapped with a projection of the fourth sub-part on the substrate.

* * * * *